US012745649B2

(12) United States Patent
Hishida

(10) Patent No.: US 12,745,649 B2
(45) Date of Patent: Sep. 22, 2026

(54) SEMICONDUCTOR DEVICE AND WAFER

(71) Applicant: Sumitomo Electric Device Innovations, Inc., Yokohama (JP)

(72) Inventor: Takeshi Hishida, Yokohama (JP)

(73) Assignee: Sumitomo Electric Device Innovations, Inc., Yokohama (JP)

( * ) Notice: Subject to any disclaimer, the term of this patent is extended or adjusted under 35 U.S.C. 154(b) by 991 days.

(21) Appl. No.: 17/864,753

(22) Filed: Jul. 14, 2022

(65) Prior Publication Data

US 2023/0051546 A1 Feb. 16, 2023

(30) Foreign Application Priority Data

Aug. 10, 2021 (JP) ................................ 2021-130622

(51) Int. Cl.
*H10W 46/00* (2026.01)
*H10D 64/23* (2025.01)
*H10P 74/00* (2026.01)

(52) U.S. Cl.
CPC .......... *H10W 46/00* (2026.01); *H10D 64/257* (2025.01); *H10P 74/273* (2026.01); *H10W 46/201* (2026.01)

(58) Field of Classification Search
CPC .. H10W 46/00; H10W 20/484; H10D 64/257; H10P 74/273
See application file for complete search history.

(56) References Cited

U.S. PATENT DOCUMENTS

2005/0040525 A1* 2/2005 Chien ..................... H01L 24/24 257/E23.101
2009/0283895 A1* 11/2009 Kikuchi .................. H01L 24/19 257/692
2010/0252864 A1* 10/2010 Kawasaki ............ H10D 30/015 257/E21.403
2019/0296112 A1* 9/2019 Yoshimochi ......... H10D 30/015
2020/0035551 A1 1/2020 Kosaka et al.
2020/0091301 A1* 3/2020 Pan ...................... H10D 30/015
2020/0266275 A1* 8/2020 Kurachi ............... H10D 30/015
(Continued)

FOREIGN PATENT DOCUMENTS

JP 2016-096318 A 5/2016
JP 2018-146444 A 9/2018
(Continued)

*Primary Examiner* — Sue A Purvis
(74) *Attorney, Agent, or Firm* — Volpe Koenig

(57) ABSTRACT

A semiconductor device includes a substrate having an upper surface and a lower surface, a metal layer provided on the lower surface of the substrate, a semiconductor element including first electrodes provided on the upper surface of the substrate, connected to the metal layer via through holes penetrating the substrate, and electrically separated from each other on the upper surface of the substrate, second electrodes provided on the upper surface of the substrate and alternately provided with the first electrodes, and a first pad provided on the upper surface of the substrate and to which the second electrodes are connected, and a protective film provided on the upper surface of the substrate to cover the first electrodes and the second electrodes, having a first opening that exposes at least a part of the first pad, and having no opening that overlaps the first electrodes.

3 Claims, 14 Drawing Sheets

(56) References Cited

U.S. PATENT DOCUMENTS

2020/0303269 A1* 9/2020 Okumura ........... G01R 31/2884
2021/0166970 A1* 6/2021 Kosaka ............. H01L 21/76843
2022/0068731 A1* 3/2022 Kwon ................. H01L 23/5389
2022/0139852 A1* 5/2022 Pun ......................... C22C 30/04
257/734
2022/0415747 A1* 12/2022 Yokoyama ............. H05K 3/321

FOREIGN PATENT DOCUMENTS

JP 2020-017647 A 1/2020
JP 2020-136459 A 8/2020

* cited by examiner

SEMICONDUCTOR DEVICE AND WAFER

CROSS REFERENCE TO RELATED APPLICATIONS

This application claims priority based on Japanese Patent Application No. 2021-130622 filed on Aug. 10, 2021, and the entire contents of the Japanese patent applications are incorporated herein by reference.

FIELD

The present disclosure relates to a semiconductor device and a wafer, for example, a semiconductor device and a wafer having a semiconductor element.

BACKGROUND

A technique is known to form a through hole in a substrate and connect one of electrodes of a semiconductor element formed on the substrate to a metal layer on a lower surface of the substrate through the through hole in the substrate (e.g. Japanese Laid-open Patent Publication No. 2020-17647). It is known to measure characteristics of the semiconductor element by contacting the semiconductor element formed on a wafer with a needle from above (e.g. Japanese Laid-open Patent Publication No. 2018-146444).

SUMMARY

A semiconductor device according to the present disclosure includes: a substrate having an upper surface and a lower surface; a metal layer provided on the lower surface of the substrate; a semiconductor element including: a plurality of first electrodes provided on the upper surface of the substrate, connected to the metal layer via through holes penetrating the substrate, and electrically separated from each other on the upper surface of the substrate; a plurality of second electrodes provided on the upper surface of the substrate and alternately provided with the plurality of first electrodes; and a first pad provided on the upper surface of the substrate and to which the plurality of second electrodes are connected; and a protective film provided on the upper surface of the substrate to cover the plurality of first electrodes and the plurality of second electrodes, having a first opening that exposes at least a part of the first pad, and having no opening that overlaps the plurality of first electrodes.

A wafer according to the present disclosure includes: a substrate having a lower surface, and an upper surface having a plurality of regions on which a plurality of chips are formed; a first metal layer provided on the lower surface of the substrate; a plurality of semiconductor elements provided corresponding to the plurality of regions on the upper surface of the substrate, respectively, each of the semiconductor elements including: a plurality of first electrodes each connected to the first metal layer via a first through hole penetrating the substrate and electrically separated from each other on the upper surface of the substrate; a plurality of second electrodes provided alternately with the plurality of first electrodes; and a pad to which the plurality of second electrodes are connected; a second metal layer provided on another region of the upper surface of the substrate other than the plurality of regions, and electrically connected to the first metal layer via a second through hole penetrating the substrate; and a protective film covering the plurality of first electrodes and the plurality of second electrodes, and not covering at least a part of the pad and at least a part of the second metal layer.

DETAILED DESCRIPTION

Figure 1:
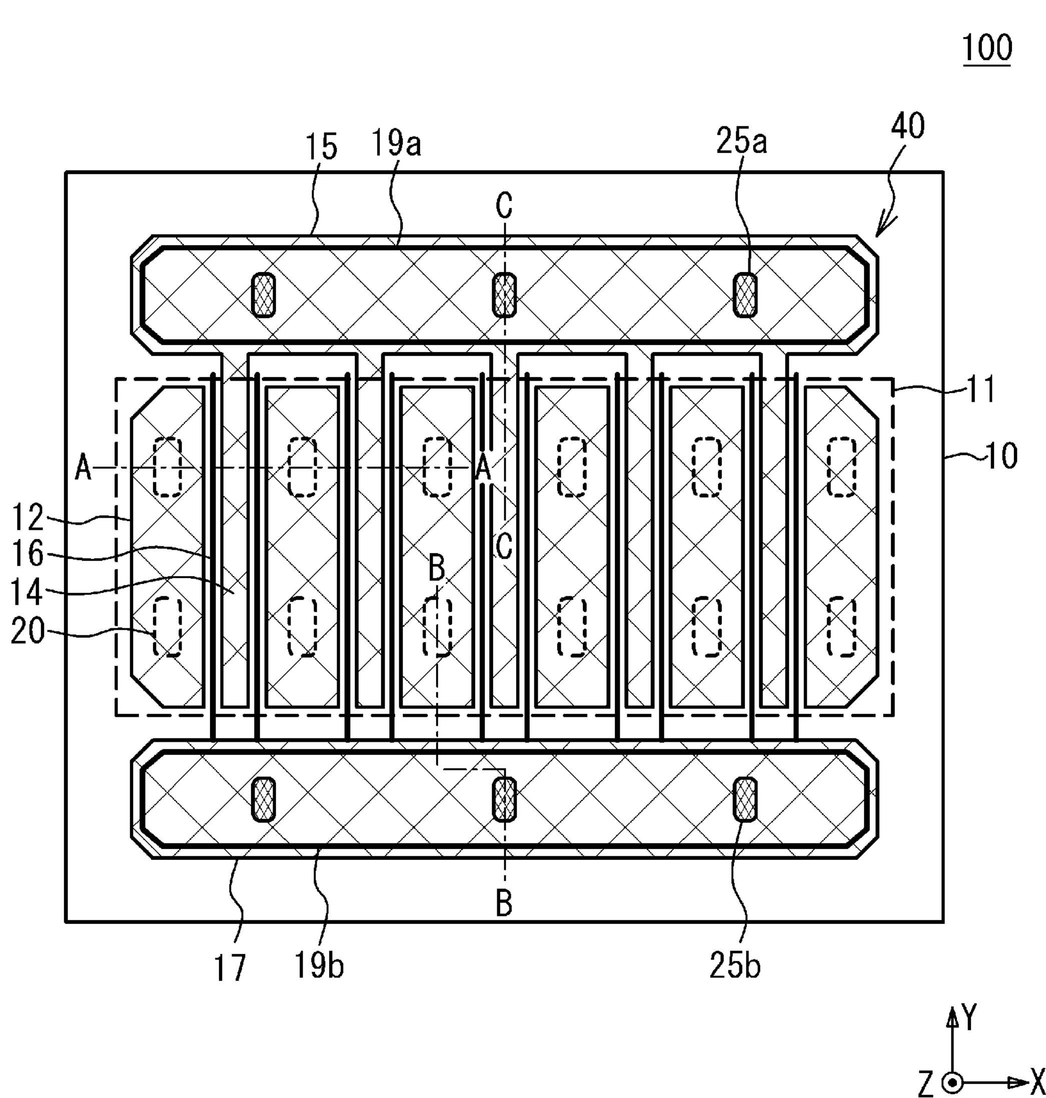
FIG. 1 is a plan view illustrating a semiconductor device according to a first embodiment.

When the characteristics of the semiconductor element are measured in a wafer state, a needle for applying a bias or a needle for applying a signal is brought into contact with a pad, on the surface of the wafer, connected to a plurality of electrodes of the semiconductor element. Therefore, another pad for applying a bias or applying a signal to the electrode connected to the metal layer on the lower surface of the substrate through the through hole is also provided on the wafer surface. As a result, the chip is increased in size.

The present disclosure has been made in view of the above problems, and an object of the present disclosure is to provide a semiconductor device and a wafer that can be reduced in size.

First, the contents of the embodiments of this disclosure are listed and explained.

(1) A semiconductor device according to the present disclosure includes: a substrate having an upper surface and a lower surface; a metal layer provided on the lower surface of the substrate; a semiconductor element including: a plurality of first electrodes provided on the upper surface of the substrate, connected to the metal layer via through holes penetrating the substrate, and electrically separated from each other on the upper surface of the substrate; a plurality of second electrodes provided on the upper surface of the substrate and alternately provided with the plurality of first electrodes; and a first pad provided on the upper surface of the substrate and to which the plurality of second electrodes are connected; and a protective film provided on the upper surface of the substrate to cover the plurality of first electrodes and the plurality of second electrodes, having a first opening that exposes at least a part of the first pad, and having no opening that overlaps the plurality of first electrodes. Thereby, the semiconductor device can be reduced in size.

(2) A needle mark may be provided on an upper surface of the first pad in the first opening, and no needle mark may be provided on the upper surface of the first electrodes.

(3) The semiconductor element may have a plurality of drain fingers provided on the upper surface of the substrate and a second pad to which the plurality of drain fingers are connected. The plurality of first electrodes may be a plurality of source fingers, and the plurality of second electrodes may be a plurality of gate fingers. Each of the plurality of gate fingers may be sandwiched between one of the plurality of source fingers and one of the plurality of drain fingers. The protective film may cover the plurality of drain fingers and have a second opening that exposes at least a part of the second pad.

(4) A needle mark may be provided on an upper surface of the second pad in the second opening.

(5) The plurality of first electrodes may be three or more first electrodes.

(6) A wafer according to the present disclosure includes: a substrate having a lower surface, and an upper surface having a plurality of regions on which a plurality of chips are formed; a first metal layer provided on the lower surface of the substrate; a plurality of semiconductor elements provided corresponding to the plurality of regions on the upper surface of the substrate, respectively, each of the semiconductor elements including: a plurality of first electrodes each connected to the first metal layer via a first through hole penetrating the substrate and electrically separated from each other on the upper surface of the substrate; a plurality of second electrodes provided alternately with the plurality of first electrodes; and a pad to which the plurality of second electrodes are connected; a second metal layer provided on another region of the upper surface of the substrate other than the plurality of regions, and electrically connected to the first metal layer via a second through hole penetrating the substrate; and a protective film covering the plurality of first electrodes and the plurality of second electrodes, and not covering at least a part of the pad and at least a part of the second metal layer. Thereby, the wafer can be reduced in size.

(7) The second metal layer may be provided in a peripheral region of the wafer.

DETAILS OF EMBODIMENTS OF THE PRESENT DISCLOSURE

Specific examples of a semiconductor device and a wafer in accordance with embodiments of the present disclosure are described below with reference to the drawings. The present disclosure is not limited to these examples, but is indicated by the claims, which are intended to include all modifications within the meaning and scope of the claims.

First Embodiment

Figure 2:
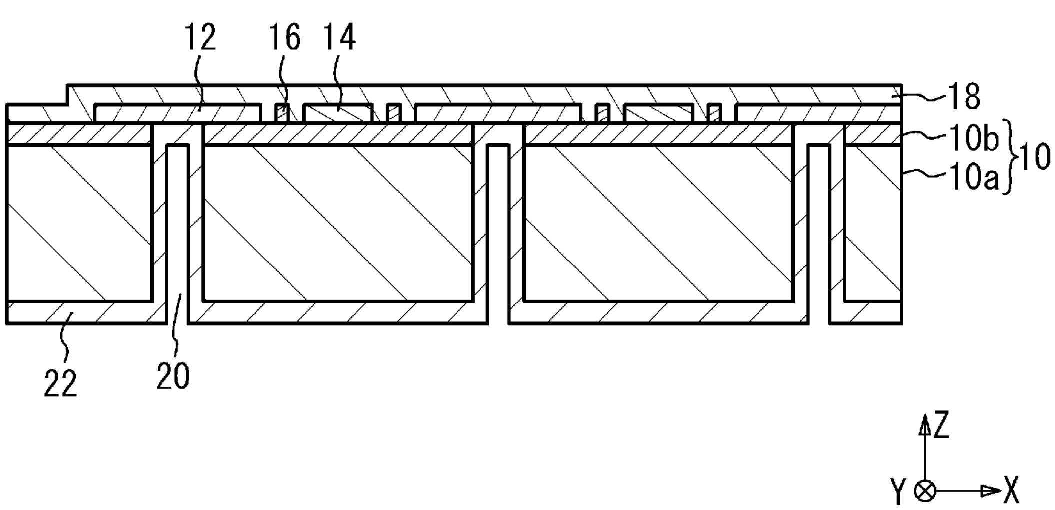
FIG. 2 is a cross-sectional view taken along line A-A of FIG. 1.
Figure 3:
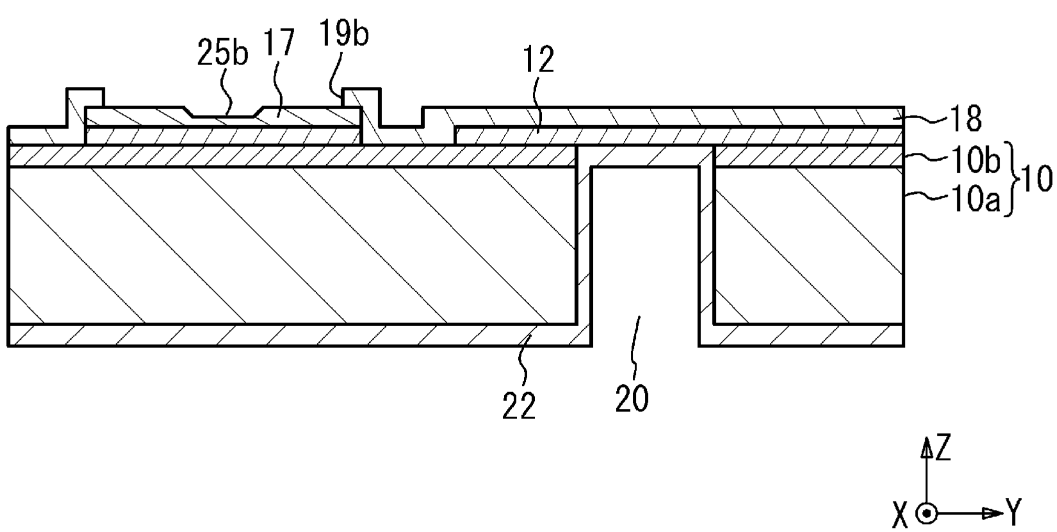
FIG. 3 is a cross-sectional view taken along line B-B of FIG. 1.
Figure 4:
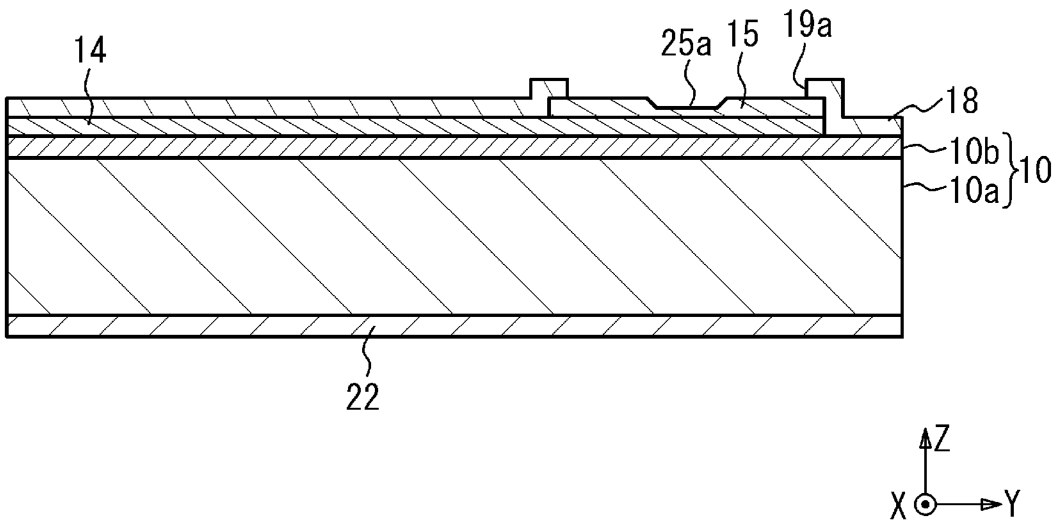
FIG. 4 is a cross-sectional view taken along line C-C of FIG. 1.

FIG. 1 is a plan view illustrating a semiconductor device according to a first embodiment. FIGS. 2 to 4 are cross-sectional views taken along line A-A, line B-B, line C-C of FIG. 1, respectively. A normal direction of an upper surface of a substrate 10 is a Z direction, an extension direction of each finger is a Y direction, and a width direction of each finger is an X direction.

As illustrated in FIGS. 1 to 4, in a semiconductor device 100, a transistor 40 is provided on the substrate 10. The substrate 10 includes a substrate **10*a* and a semiconductor layer 10*b* provided on the substrate 10*a*. A region in which the semiconductor layer 10*b* is inactivated by ion implantation or the like is an inactive region, and a region in which the semiconductor layer 10*b* is not inactivated is an active region 11. A metal layer 22 is provided on a lower surface of the substrate 10**.

The transistor 40 is a multi-finger FET (Field Effect Transistor), and mainly includes a plurality of source fingers 12, a plurality of drain fingers 14, a plurality of gate fingers 16, a drain pad 15, and a gate pad 17, which are provided on the substrate 10. The source finger 12 and the drain finger 14 are arranged alternately in the X direction on the substrate 10. The gate finger 16 is provided between the source finger 12 and the drain finger 14 in the X direction. The source finger 12 is electrically connected to the metal layer 22 via through holes 20 penetrating the substrate 10 and is short-circuited. The plurality of drain fingers 14 are commonly connected to the drain pad 15 at a +Y end. The plurality of gate fingers 16 are commonly connected to the gate pad 17 at a −Y end.

A protective film 18 is provided on the substrate 10 so as to cover the source finger 12, the drain finger 14, and the gate finger 16. The protective film 18 has openings **19*a* and 19*b* that expose at least a portion of the drain pad 15 and at least a portion of the gate pad 17, respectively. In the measured transistor 40 in the semiconductor device 100, needle marks 25*a* and 25*b* are formed on the drain pad 15 and the gate pad 17 in the openings 19*a* and 19*b*, respectively. The needle marks 25*a* and 25*b* are marks where the needles for measuring the characteristics of the transistor come into contact with the drain pad 15 and the gate pad 17**.

When the semiconductor device 100 is a nitride semiconductor device, the substrate **10*a* is, for example, a SiC substrate, a silicon substrate, a GaN substrate, or a sapphire substrate. The semiconductor layer 10*b* includes a nitride semiconductor layer such as a GaN layer, an AlGaN layer and/or an InGaN layer. When the semiconductor device is a GaAs-based semiconductor device, the substrate 10*a* is, for example, a GaAs substrate. The semiconductor layer 10*b* includes an arsenide semiconductor layer such as a GaAs layer, an AlGaAs layer and/or an InGaAs layer. The source finger 12 and the drain finger 14 are metal films, and include, for example, an adhesive film (for example, a titanium film) and an aluminum film arranged in this order from the substrate 10 side. The gate finger 16 is a metal film, and includes, for example, an adhesive film (for example, a nickel film) and a gold film arranged in this order from the substrate 10 side. The drain pad 15 and the gate pad 17 have the same metal film as the drain finger 14 and the gate finger 16, respectively. Further, each of the drain pad 15 and the gate pad 17 has a wiring layer (for example, a gold layer) on the metal film. The metal layer 22 includes, for example, a close contact layer and a gold layer arranged in this order from the substrate 10 side. The protective film 18** is, for example, an inorganic insulating film such as a silicon nitride film or a silicon oxide film, or an organic insulating film such as a polyimide film.

Figure 5:
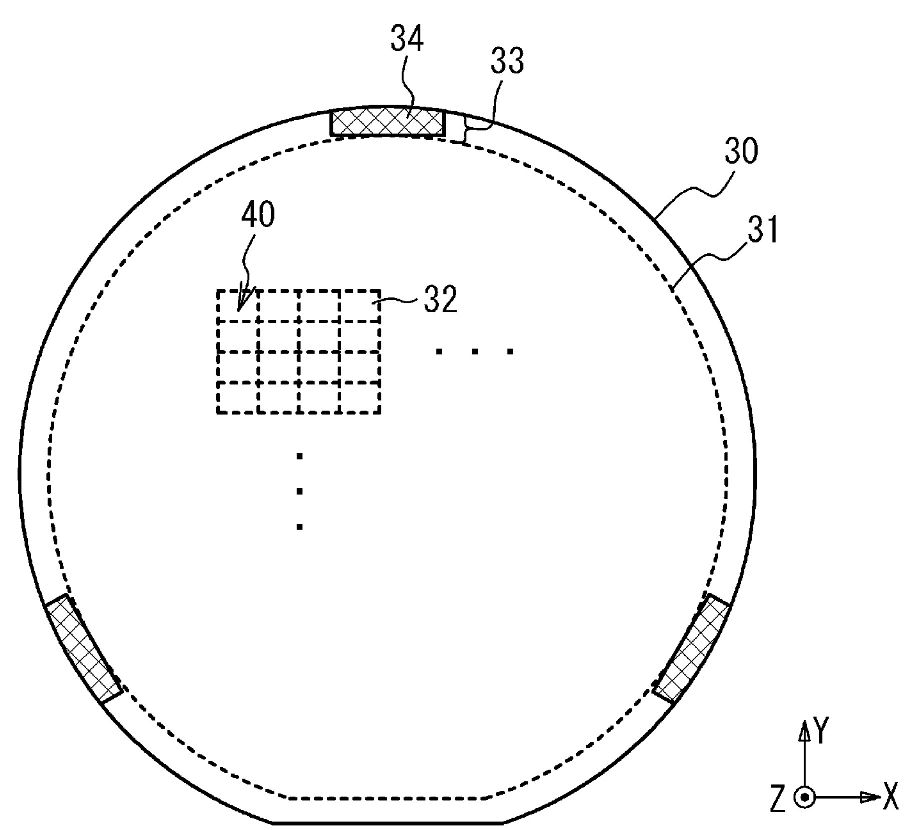
FIG. 5 is a plan view illustrating a wafer according to the first embodiment.

FIG. 5 is a plan view illustrating a wafer according to the first embodiment. As illustrated in FIG. 5, a planar shape of a wafer 30 is a circular shape, and an orientation flat is partially provided. The size of the wafer 30 is 3 inches, 4 inches, 6 inches, or the like. A region within a predetermined distance from the outer circumference of the wafer 30 is an non-effective region 33. A width of the non-effective region 33 is, for example, 1 mm to 5 mm. A region inside the non-effective region 33 is an effective region 31. The effective region 31 is a region on which the transistor 40 is formed. The transistor 40 formed in the non-effective region 33 is not shipped because its characteristics are not guaranteed. A plurality of chip regions 32 on which the plurality of transistors 40 are to be formed are provided in a matrix in the X direction and the Y direction. The size of the chip region 32 is, for example, 0.5 $mm^2$ to 10 $mm^2$. The metal layers 34 are provided in the non-effective region 33 in a peripheral portion of the wafer 30. Three metal layers 34 are provided along the circumference of the wafer at substantially equal intervals. The number of metal layers 34 may be one or more.

Figure 6:
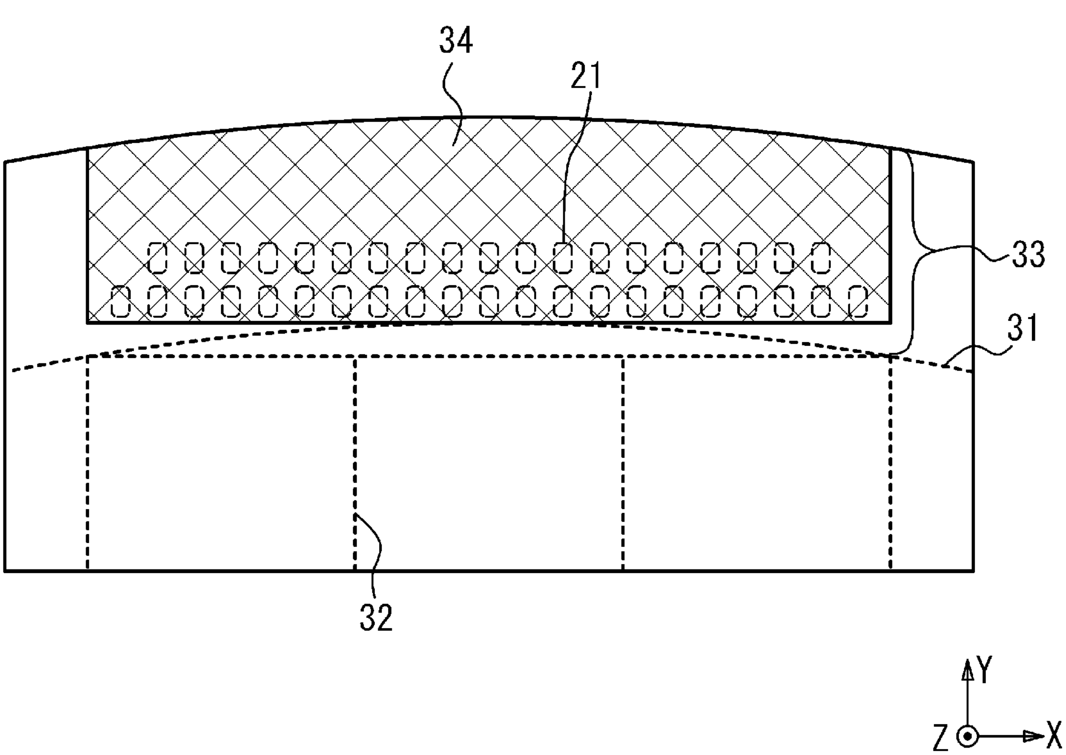
FIG. 6 is an enlarged plan view illustrating the vicinity of a metal layer 34 of the wafer according to the first embodiment.
Figure 7:
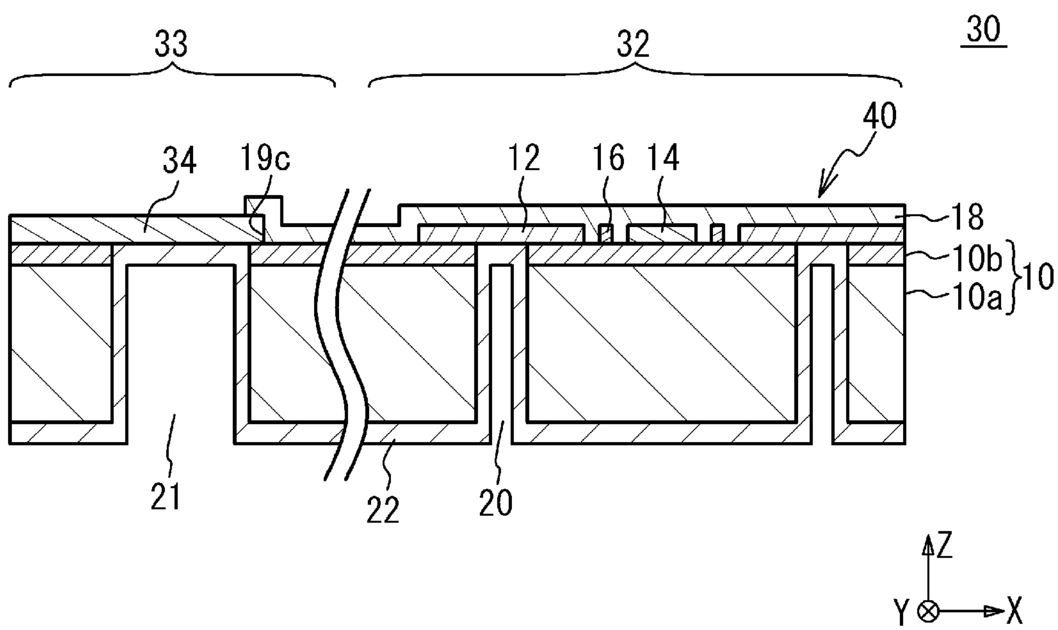
FIG. 7 is a cross-sectional view illustrating the wafer according to the first embodiment.

FIG. 6 is an enlarged plan view illustrating the vicinity of the metal layer 34 of the wafer according to the first embodiment. FIG. 7 is a cross-sectional view illustrating the wafer according to the first embodiment. FIG. 7 illustrates the chip region 32 and the non-effective region 33 provided with the metal layer 34. As illustrated in FIGS. 6 and 7, through holes 21 penetrating the substrate 10 are provided in the non-effective region 33. The plurality of through holes 21 are provided. The number of through holes 21 is appropriately set according to the magnitude of the current flowing when measuring the characteristics of the transistor 40 described later. The metal layer 34 is electrically connected to the metal layer 22 via the through holes 21 and is short-circuited. The metal layer 34 and the source finger 12 of the transistor 40 are electrically connected via the metal layer 22 and short-circuited. The protective film 18 has an opening 19*c*, and the metal layer 34 is exposed from the opening 19*c*. The metal layer 34 is, for example, a gold layer.

Manufacturing Method of First Embodiment

Figure 8A:
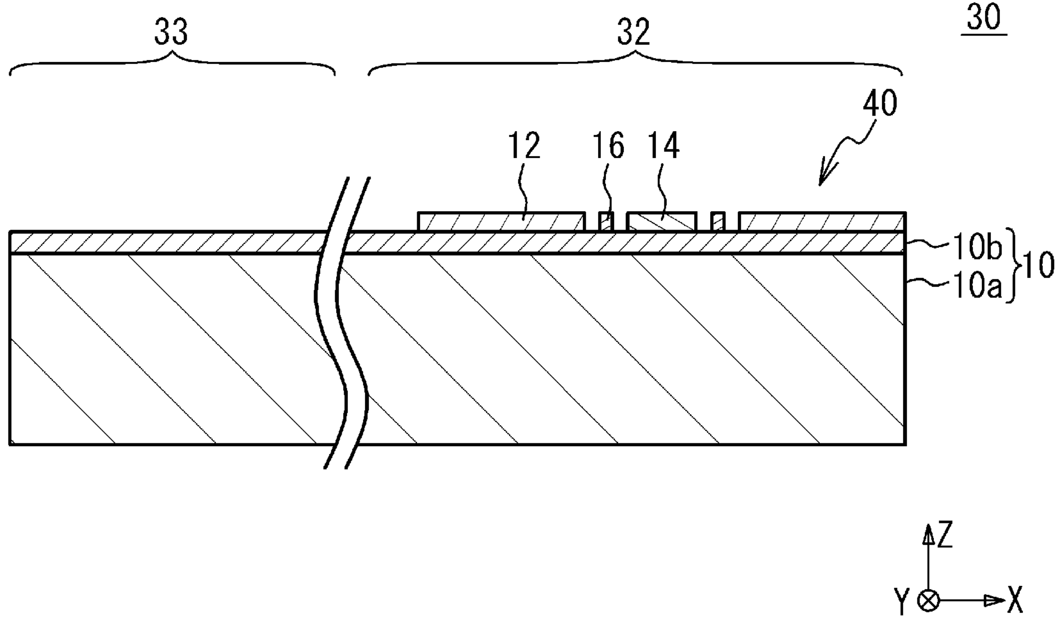
FIG. 8A is a cross-sectional view illustrating a method of manufacturing the semiconductor device according to the first embodiment.

FIGS. 8A to 8D are cross-sectional views illustrating a method of manufacturing the semiconductor device according to the first embodiment. As illustrated in FIG. 8A, the source finger 12, the drain finger 14 and the gate finger 16 are formed on the substrate 10 in the chip region 32 by using, for example, a vacuum deposition method and a lift-off method. At this time, metal layers of parts of the drain pad 15 and the gate pad 17 may be formed. This forms the transistor 40. The thickness of the substrate 10 is, for example, 500 μm.

Figure 8B:
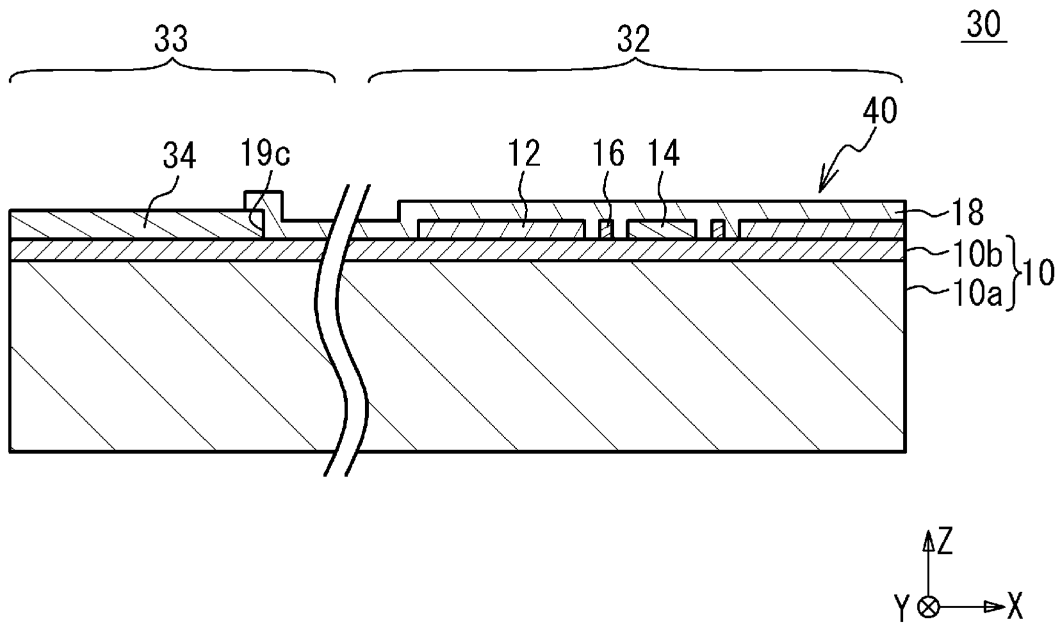
FIG. 8B is a cross-sectional view illustrating a method of manufacturing the semiconductor device according to the first embodiment.

As illustrated in FIG. 8B, the metal layer 34 is formed in the non-effective region 33 by using, for example, an electrolytic plating method. The metal layer 34 functions as an electrode for supplying a current when the wiring layer (for example, the drain pad 15 and the gate pad 17) is formed in the chip region 32 by the electrolytic plating method. The metal layer 34 and the wiring layer are formed as follows. First, a seed metal layer is formed on the entire surface of the wafer 30. The seed metal layer includes, for example, an adhesion layer and a low resistance layer (for example, a gold layer) arranged in this order from a substrate 10 side. A patterned mask layer (for example, a photoresist layer) is formed on the seed metal layer. At this time, the mask layer is not formed in a region forming the metal layer 34 and the wiring layer. By supplying the current to the seed metal layer from the region where the metal layer 34 is to be formed, a plating layer is formed on the seed metal layer where the mask layer is not formed. The seed metal layer is etched using the plating layer as a mask. This forms the metal layer 34 and the wiring layer. The protective film 18 is formed on the substrate 10 so as to cover the source finger 12, the drain finger 14, the gate finger 16, and the metal layer 34. The openings 19*a* to 19*c* are formed in the protective film 18.

Figure 8C:
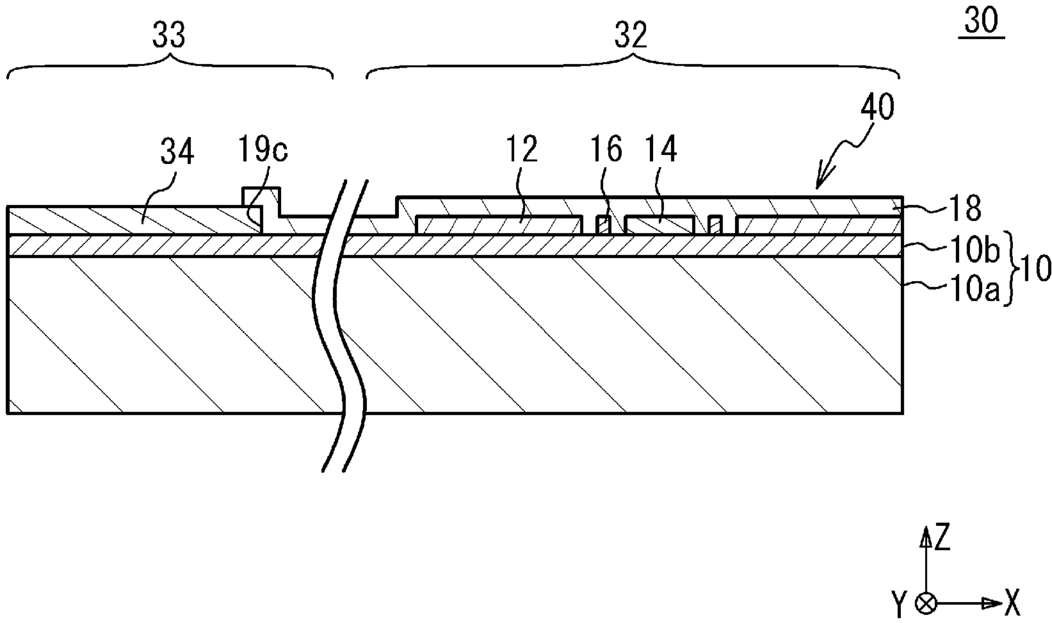
FIG. 8C is a cross-sectional view illustrating a method of manufacturing the semiconductor device according to the first embodiment.
Figure 8D:
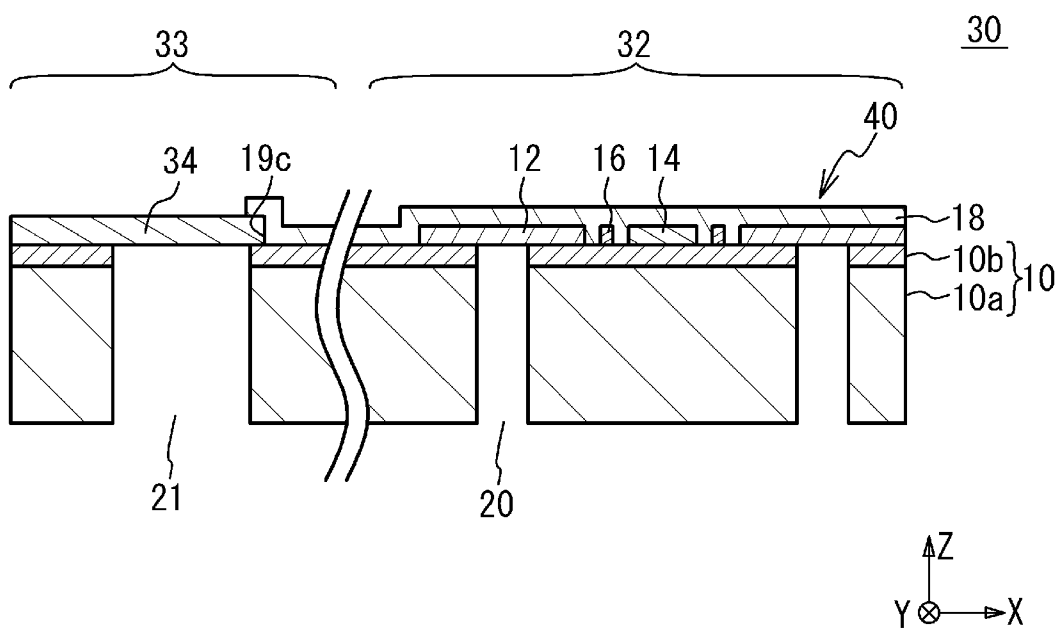
FIG. 8D is a cross-sectional view illustrating a method of manufacturing the semiconductor device according to the first embodiment.

As illustrated in FIG. 8C, the lower surface of the substrate 10 is ground or polished. This makes the substrate 10 thinner. The thickness of the substrate 10 is, for example, 10 μm to 100 μm. As illustrated in FIG. 8D, the through holes 20 and 21 penetrating the substrate 10 are formed by, for example, an etching method. After that, the metal layer 22 is formed under the substrate 10 and in the through holes 20 and 21 by using, for example, the electrolytic plating method. The thickness of the metal layer 22 is, for example, 5 μm to 50 μm. This completes the wafer illustrated in FIG. 7.

Figure 9:
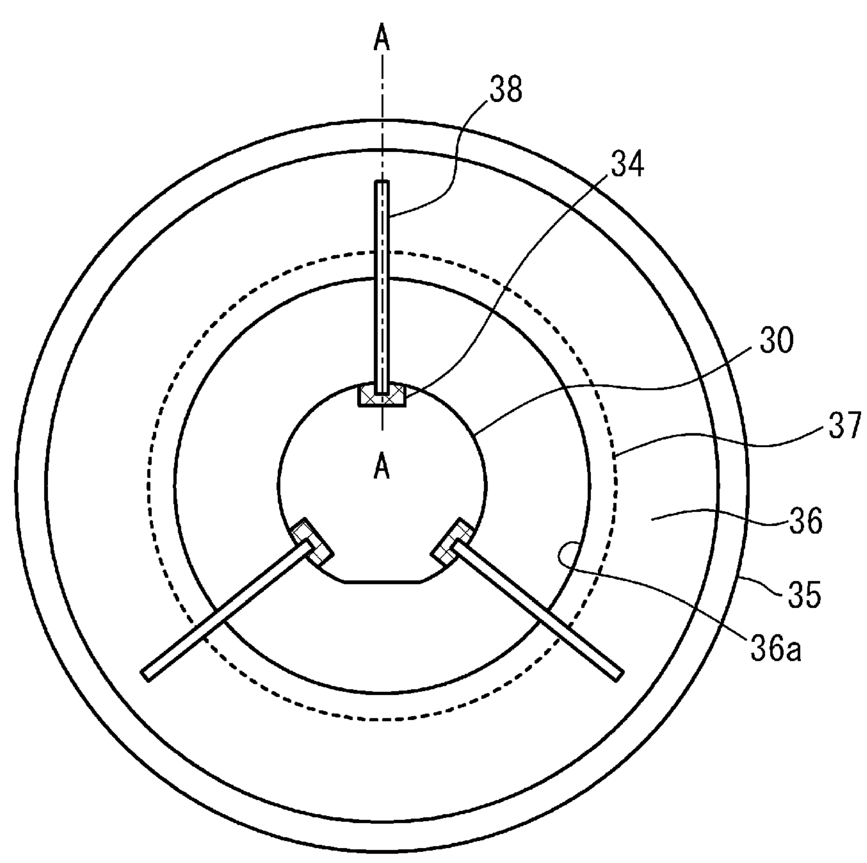
FIG. 9 is a plan view illustrating a measurement method of the semiconductor device according to the first embodiment.
Figure 10:
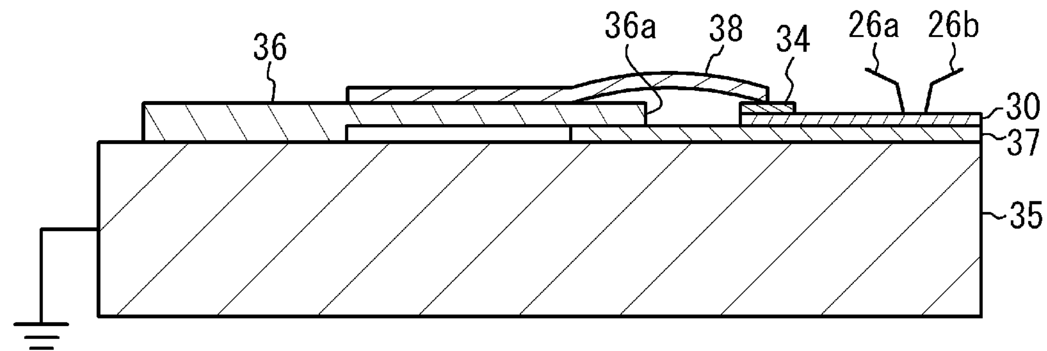
FIG. 10 is a cross-sectional view taken along line A-A of FIG. 9.

FIG. 9 is a plan view illustrating a measurement method of the semiconductor device according to the first embodiment. FIG. 10 is a cross-sectional view taken along line A-A of FIG. 9. A reference potential such as a ground potential is supplied to a stage 35. The stage 35 sucks a frame 36 by vacuum suction or the like. The frame 36 is, for example, a metal plate such as stainless steel, and is electrically connected to the stage 35 and short-circuited. An opening 36*a* is formed in the center of the frame 36. A sheet 37 is attached at the inside of the opening 36*a*. The sheet 37 is, for example, an insulating resin sheet. The wafer 30 is attached on the sheet 37. Metal springs 38 are in contact with an upper surface of the metal layer 34 of the wafer 30. The metal springs 38 are fixed and electrically connected to the frame 36, and short-circuited. Thereby, the reference potential is supplied to the metal layer 34 through the metal springs 38, the frame 36, and the stage 35.

In order to improve the heat dissipation from the transistor 40 in the semiconductor device 100, the wafer 30 is very thin, for example, 10 μm to 100 μm. Therefore, the wafer 30 may warp. Further, if the wafer 30 is brought into direct contact with the stage 35, the wafer 30 may be cracked. Therefore, the wafer 30 is attached to the sheet 37, and the sheet 37 is attached to the frame 36. This suppresses the wafer 30 from warping and the wafer 30 from cracking. However, when the wafer 30 is attached to the sheet 37, the metal layer 22 on a lower surface of the wafer 30 is not electrically connected to the stage 35. Therefore, the stage 35 is electrically connected to the metal layer 34 via the frame 36 and the metal springs 38. Thereby, the reference potential is supplied from the metal layer 34 to the source finger 12 via the through hole 21, the metal layer 22, and the through hole 20.

Figure 11:
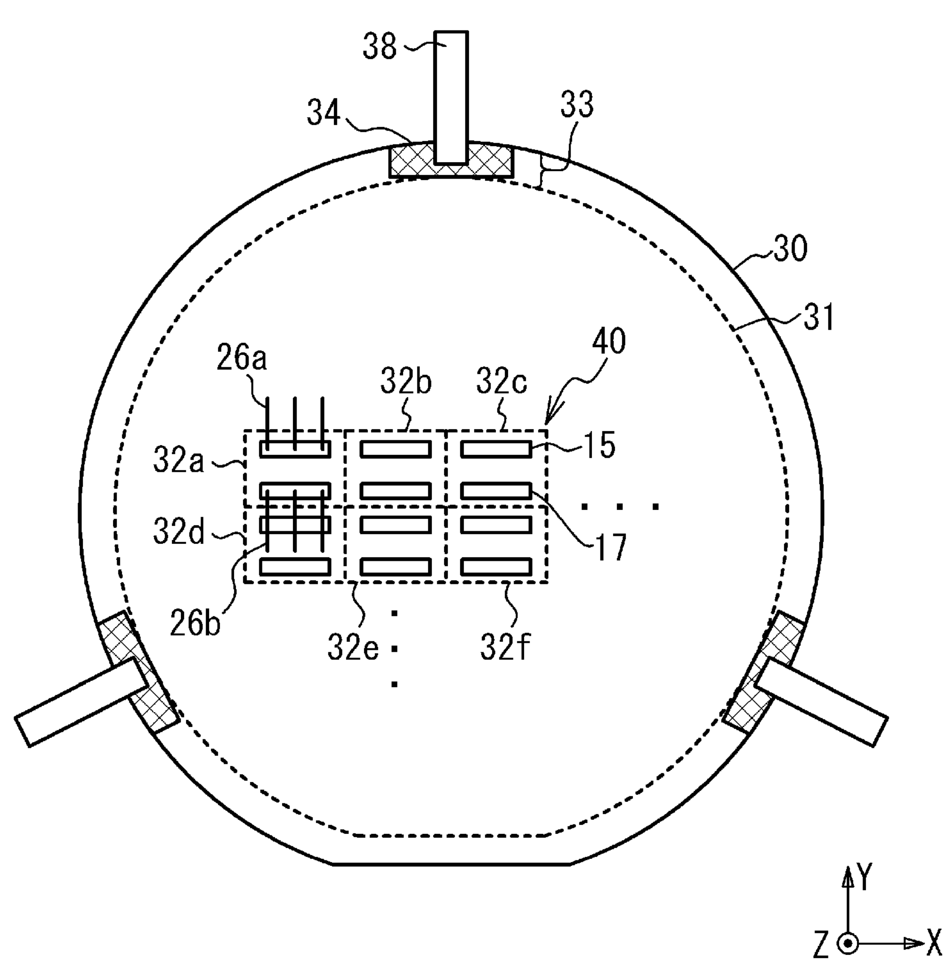
FIG. 11 is an enlarged plan view illustrating the vicinity of the wafer of FIG. 9.

FIG. 11 is an enlarged plan view illustrating the vicinity of the wafer of FIG. 9. As illustrated in FIG. 11, needles 26*a* and 26*b* are brought into contact with the drain pad 15 and the gate pad 17 in a chip region 32*a* on an upper surface of the wafer 30, respectively. The reference potential is supplied from the metal layer 34 through the metal layer 22 to the source finger 12, and the electric potential is supplied from the needles 26*a* and 26*b* to the drain pad 15 and the gate pad 17, so that the transistor characteristics of the transistor 40 in the chip region 32*a* can be measured. Then, the needles 26*a* and 26*b* are lifted from the surface of the wafer to move the stage 35. Then, the needles 26*a* and 26*b* are lowered onto the drain pad 15 and the gate pad 17 in the chip region 32*b*, respectively, and the needles 26*a* and 26*b* are brought into contact with the drain pad 15 and the gate pad 17, respectively. This makes it possible to measure the transistor characteristics of the transistor 40 in the chip region 32*b*. Similarly, the characteristics of the transistor 40 in chip regions 32*c* to 32*f* are sequentially measured.

The semiconductor device 100 according to the first embodiment can be manufactured by cutting the wafer 30 after measuring the characteristics of the transistor 40 formed in the chip region 32. For example, the semiconductor device 100 is selected based on the measurement result of the transistor 40, the good semiconductor device 100 is advanced to the next process, and the defective semiconductor device 100 is not advanced to the next process as a defective product.

First Comparative Example

As a method of suppressing warpage or cracking of the wafer 30 because the wafer 30 is thin, a method of measuring the characteristics of the transistor before thinning the wafer 30 can be considered. Further, it is considered to attach the wafer 30 to the insulating sheet after forming the metal layer 22 to measure the transistor 40. In this case, the needle is brought into contact with the source finger 12 in order to supply the reference potential to the source finger 12.

Figure 12:
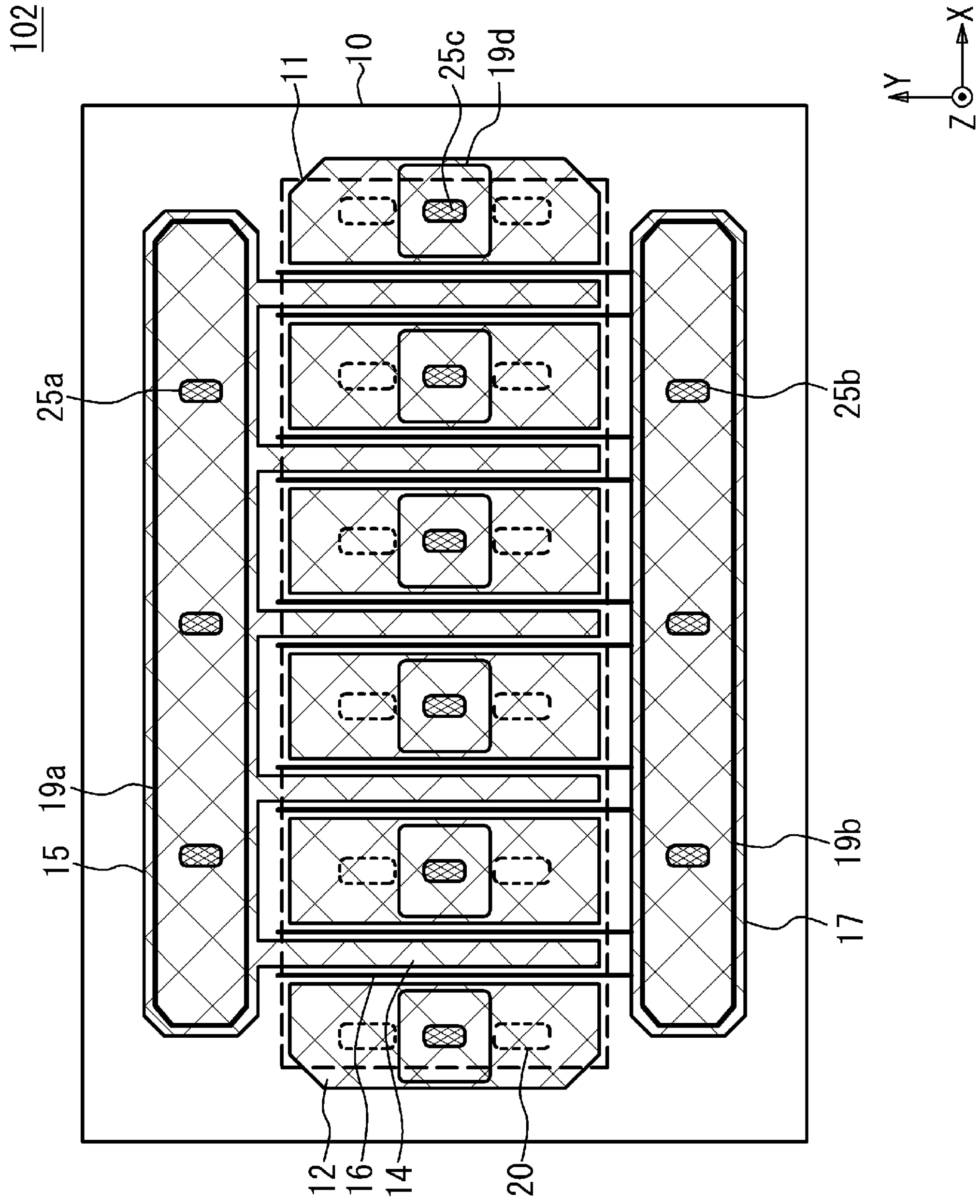
FIG. 12 is a plan view illustrating a semiconductor device according to a first comparative example.

FIG. 12 is a plan view illustrating a semiconductor device according to a first comparative example. As illustrated in FIG. 12, in a semiconductor device 102 according to the first comparative example, openings 19*d* are provided in the protective film 18 on the source finger 12. When the transistor characteristics are measured, the needle is brought into contact with the source finger 12 through the opening 19*d*. Therefore, a needle mark 25*c* is formed in the opening 19*d* on the source finger 12. In order to bring the needle into contact with the source finger 12, the width of the opening 19*d* is required to be about 80 μm to 100 μm. Therefore, the width of the source finger 12 in the X direction becomes wide. This results in a wider width in the X direction of the source finger 12. This increases the chip size of the semiconductor device 102. Further, if a conductive foreign matter adheres to the opening 19*d*, it may be short-circuited with another finger. Further, if a defect exists in the through hole 20, the metal layer 22, or the like, it is not reflected in the characteristics of the transistor 40.

Second Comparative Example

Figure 13:
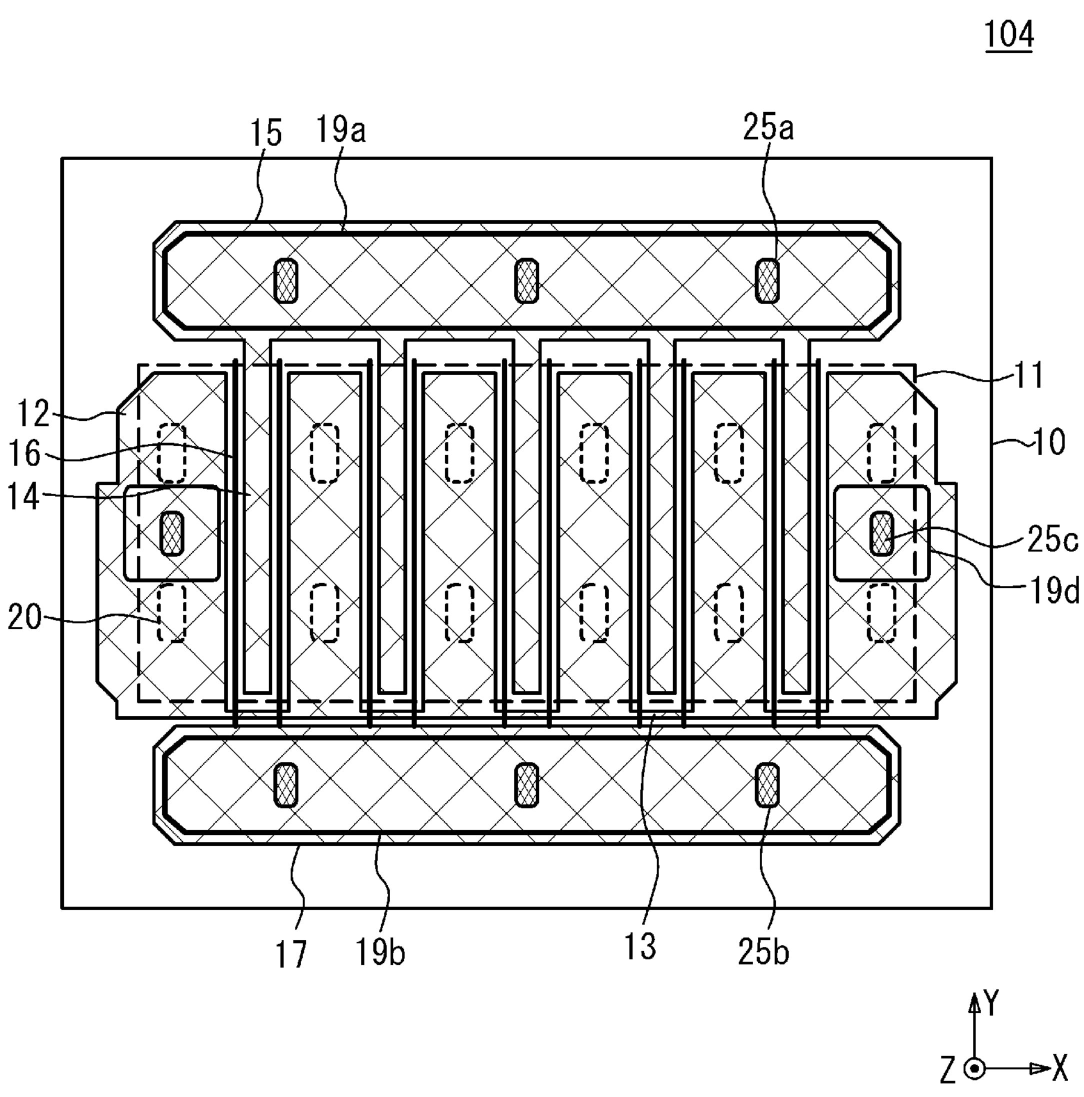
FIG. 13 is a plan view illustrating a semiconductor device according to a second comparative example.

FIG. 13 is a plan view illustrating a semiconductor device according to a second comparative example. As illustrated in FIG. 13, in a semiconductor device 104 according to the second comparative example, the openings 19*d* are provided in the source fingers 12 at both ends in the X direction. This makes it possible to narrow the width in the X direction of the source fingers 12 other than those at both ends, and thus reduce the chip size compared to the first comparative example. However, the needle cannot come into contact with the source fingers 12 other than those at both ends. Therefore, wirings 13 for electrically connecting the source fingers 12 to each other are provided. The wiring 13 intersects with the gate finger 16. This increases a parasitic capacitance between the gate and the source, and deteriorates the high frequency characteristics of the transistor 40.

Further, the transistor 40 has a configuration including a plurality of unit transistors having a layout of the smallest unit that operates as a transistor. In the unit transistor, one gate finger 16 is sandwiched between one source finger 12 and one drain finger 14. In the layout as in the second comparative example, the unit transistors at both ends in the X direction and the unit transistors other than those at both ends are not equal to each other. For example, in the unit transistors at both ends, the width of the source finger 12 in the X direction is larger than the width of the source finger 12 of the unit transistors other than those at both ends. As a result, the performance of the transistor 40 may deteriorate. Especially in the case of a transistor operating with a high frequency signal, the high frequency characteristics may differ for each unit transistor. Thereby, the performance of the transistor 40 is likely to deteriorate. In order to avoid this deterioration in the second comparative example, it is preferable to provide the openings 19*d* in the protective film 18 on all the source fingers 12 as in the first comparative example, respectively. In the first comparative example, the chip size becomes large.

According to the first embodiment, the wafer 30 includes the plurality of transistors 40 (semiconductor elements) correspondingly provided on the substrate 10 in the plurality of chip regions 32, as illustrated in FIG. 5. As illustrated in FIGS. 1 to 4, in the transistor 40, the plurality of source fingers 12 (first electrodes) are connected to the metal layer 22 (first metal layer) via the through holes 20 (first through holes), respectively, and are electrically separated from each other on the substrate 10. The gate fingers 16 (second electrode) are provided alternately with the plurality of source fingers 12. The plurality of gate fingers 16 are connected to the gate pad 17 (first pad). As illustrated in FIGS. 5 to 7, the metal layer 34 (second metal layer) is provided on the non-effective region 33 of the substrate 10 other than the plurality of chip regions 32, and is electrically connected to the metal layer 22 via the through holes 21 (second through hole). As illustrated in FIGS. 8A to 8D and FIG. 7, the wafer 30 is prepared. Then, as illustrated in FIGS. 9 to 11, the characteristics of the transistor 40 in the chip region 32 are measured by bringing the needle 26*a* into contact with the gate pad 17 in at least one chip region 32 and supplying the electric potential to the metal layer 34.

This allows the characteristics of transistor 40 to be measured without the needle contacting the source finger 12. Therefore, it is not necessary to widen the width of the source finger 12 in order to bring the needle into contact with the source finger 12 as in the first comparative example. Therefore, the semiconductor device 100 can be reduced in size. Further, it is not necessary to provide the wiring 13 for connecting the source fingers 12 to each other as in the second comparative example. Therefore, the parasitic capacitance between the gate and the source can be suppressed, and the high frequency characteristics of the transistor 40 can be improved. Further, it is possible to suppress a short circuit due to the foreign matter adhering to the opening 19*d*. When the defect exists in the through hole 20 and the metal layer 22, it is reflected in the characteristics of the transistor 40.

Before a step of measuring the characteristics of the transistor 40, the lower surface of the wafer 30 and a part of the lower surface of the metal frame 36 are attached to the insulating sheet 37 as illustrated in FIG. 10. The lower surface of the insulating sheet 37 and a region of the lower surface of the metal frame 36 to which the insulating sheet 37 is not attached are brought into contact with the stage 35. The metal frame 36 and the upper surface of the metal layer 34 are electrically connected to each other. Thereby, the electric potential can be supplied from the stage 35 to the metal layer 34 via the metal frame 36. Here, a probe such as the metal spring 38 may be fixed to the stage 35 to apply the electric potential to the metal layer 34 without passing through the metal frame 36.

In the wafer 30 manufactured using such a manufacturing method, the protective film 18 covers the plurality of source fingers 12 and the plurality of gate fingers 16 and does not cover at least a part of the gate pad 17 and at least a part of the metal layer 34. Thereby, the needle 26*b* can be brought into contact with the gate pad 17, and the probe such as the metal spring 38 can be brought into contact with the metal layer 34.

As illustrated in FIG. 9, the metal layer 34 is provided in a peripheral region of the wafer 30. Thereby, the probe such as the metal spring 38 can be brought into contact with the upper surface of the metal layer 34 from the outside of the wafer 30. Further, as illustrated in FIG. 5, the metal layer 34 can be provided without reducing the number of chip regions 32 by providing the metal layer 34 in the non-effective region 33.

As illustrated in FIG. 8B, the metal layer 34 is used as an electrode for forming the wiring layer such as the drain pad 15 and the gate pad 17 by the electrolytic plating method. This can reduce the process of providing the metal layer 34.

In the semiconductor device 100 manufactured by using such a manufacturing method, as illustrated in FIGS. 1 to 4, the protective film 18 has the opening 19*b* (first opening) that exposes at least a part of the gate pad 17 and the opening 19*a* (second opening) that exposes at least a part of the drain pad 15. This allows the needles 26*a* and 26*b* to bring into contact with the drain pad 15 and gate pad 17, respectively. Further, the semiconductor device 100 can be reduced in size as compared with the first and the second comparative examples. Therefore, the needle mark 25*b* is provided on the upper surface of the gate pad 17 in the opening 19*b*, and the needle mark 25*a* is provided on the upper surface of the drain pad 15 in the opening 19*a*. Further, the protective film 18 does not have an opening overlapping the plurality of source fingers 12. No needle mark is provided on the upper surface of the source finger 12.

When the number of source fingers 12 in the transistor 40 is 3 or more as illustrated in FIG. 12 of the first comparative example, the needles are brought into contact with the source fingers 12 other than those at both sides, and hence the width of each of the source fingers 12 other than those at both sides in the X direction becomes wider and the chip size becomes larger. Further, if the wiring 13 for connecting the source fingers 12 to each other is provided as illustrated in FIG. 13 of the second comparative example, the high frequency characteristics of the transistor 40 are deteriorated. Therefore, when the number of source fingers 12 is 3 or more, and further 4 or more or 5 or more, it is preferable to electrically connect the metal layer 34 to the source fingers 12 via the metal layer 22.

In the first embodiment, the FET is described as an example as the semiconductor element. The semiconductor element may be a transistor other than the FET, or a semiconductor element other than the transistor. When the semiconductor element is a multi-finger FET, the number of source fingers 12 increases. Further, since the gate finger 16 is sandwiched between the source finger 12 and the drain finger 14, the gate finger 16 and the wiring 13 intersect with each other as in the second comparative example, and the gate-source parasitic capacitance increases. Therefore, it is preferable to electrically connect the metal layer 34 to the source finger 12 via the metal layer 22.

When the thickness of the substrate 10 is 100 μm or less, the wafer 30 warps. When the thickness of the substrate 10 is 50 μm or less and further 30 μm or less, the wafer 30 further warps. Therefore, it becomes difficult to suck the wafer 30 to the stage 35. Therefore, it is preferable to electrically connect the metal layer 34 to the source finger 12 via the metal layer 22.

The embodiments disclosed here should be considered illustrative in all respects and not restrictive. The present disclosure is not limited to the specific embodiments described above, but various variations and changes are possible within the scope of the gist of the present disclosure as described in the claims.

What is claimed is:

1. A semiconductor device comprising:

a substrate having an upper surface and a lower surface;

a metal layer provided on the lower surface of the substrate; and a semiconductor element on the upper surface the semiconductor element including:

a plurality of drain fingers provided on the upper surface of the substrate;

a plurality of source fingers provided on the upper surface of the substrate and alternately arranged with the plurality of drain fingers in a first direction, each of the plurality of source fingers being electrically separated from each other on the upper surface and each connected to the metal layer by a respective through hole penetrating the substrate;

a plurality of gate fingers provided on the upper surface of the substrate, each gate finger being sandwiched between one of the plurality of source fingers and one of the plurality of drain fingers;

a first pad provided on the upper surface of the substrate and to which the plurality of gate fingers are connected; and a second pad provided on the upper surface of the substrate and to which the plurality of drain fingers are connected; and a protective film provided on the upper surface of the substrate to cover the plurality of source fingers, the plurality of gate fingers, and the plurality of drain fingers, the protective film, having a first opening that exposes at least a part of the first pad and a second opening that exposes at least a part of the second pad, and having no opening that overlaps any of the plurality of source fingers or any of the plurality of drain fingers, wherein a needle mark is provided on an upper surface of the first pad in the first opening and the second pad in the second opening, and no needle mark is provided on the upper surface of the source fingers.

2. The semiconductor device as claimed in claim 1, wherein a second needle mark is provided on an upper surface of the second pad in the second opening.

3. The semiconductor device as claimed in claim 1, wherein the plurality of source fingers are three or more source fingers.

* * * * *